United States Patent
Wrschka et al.

(10) Patent No.: US 6,709,947 B1
(45) Date of Patent: Mar. 23, 2004

(54) METHOD OF AREA ENHANCEMENT IN CAPACITOR PLATES

(75) Inventors: Porshia S. Wrschka, Danbury, CT (US); Irene McStay, Hopewell Junction, NY (US)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 0 days.

(21) Appl. No.: 10/314,548

(22) Filed: Dec. 6, 2002

(51) Int. Cl.[7] .............................................. H01L 21/20
(52) U.S. Cl. ...................................... 438/398; 438/964
(58) Field of Search ................................ 438/398, 964, 438/381, 396

(56) References Cited

U.S. PATENT DOCUMENTS

| | | | |
|---|---|---|---|
| 5,191,509 A | 3/1993 | Wen |
| 5,245,206 A | 9/1993 | Chu et al. |
| 5,266,514 A | 11/1993 | Tuan et al. |
| 5,366,917 A | 11/1994 | Watanabe et al. |
| 5,877,061 A | 3/1999 | Halle et al. |
| 6,025,225 A | 2/2000 | Forbes et al. |
| 6,027,970 A | 2/2000 | Sharan et al. |
| 6,177,696 B1 | 1/2001 | Bronner et al. |
| 6,187,628 B1 | 2/2001 | Thakur et al. |

*Primary Examiner*—Michael S. Lebentritt
*Assistant Examiner*—Beth E. Owens
(74) *Attorney, Agent, or Firm*—Todd M. C. Li

(57) ABSTRACT

A method and structure for increasing the area and capacitance of both trench and planar integrated circuit capacitors uses Si nodules deposited on a thin dielectric seeding layer that is absorbed during subsequent thermal processing, thereby avoiding a high resistance layer in the capacitor.

20 Claims, 2 Drawing Sheets

METHOD OF AREA ENHANCEMENT IN CAPACITOR PLATES

FIELD OF THE INVENTION

The field of the invention is the formation of a capacitor with increased surface area due to silicon nodules; in particular capacitors for dynamic random access memory (DRAM) integrated circuit devices.

BACKGROUND OF THE INVENTION

The continued scaling of DRAM cell sizes requires maintaining a sufficiently high storage capacitance per cell. Physical limitations such as high leakage current and excessive failure rate have prevented aggressively reducing capacitor dielectric thickness. Therefore, techniques to increase effective storage surface area are needed for further scaling of DRAMs in the submicron regime.

One such technique involves the use of silicon nodules deposited on the surface of the plate of one of the capacitor plates, thereby increasing the area of the plate. This technique is compatible with existing silicon processing techniques and does not introduce extraordinary challenges to device and tooling integration. The silicon nodules deposited on the capacitor electrode are typically hemispherical in shape. Modulation of their size, shape and density is important for the optimization of capacitance.

There are a variety of conventional techniques for increasing the surface area of a capacitor electrode with Si nodules. In conventional processes, (1) an amorphous Si layer is deposited, (2) it is then seeded and then (3) the film is annealed under high vacuum conditions to form the nodules. Seeding refers to the formation of Si nuclei on the a-silicon film. A significant disadvantage of this technique is that it is not suitable for trench technology in the submicron range because of the loss of available trench diameter with the deposition of the first a-silicon layer (which is typically 100 nm thick). The thick amorphous silicon film is necessary in the conventional scheme because it provides a source from which the silicon nodules may grow and increase the size of the nuclei during anneal.

SUMMARY OF THE INVENTION

It is an object of the present invention to provide a method of creating stable Si nodules that may be used to enhance the area of a planar capacitor electrode.

A feature of the invention is the deposition of silicon on a smooth dielectric seed layer.

Another feature of the invention is the use of a thin dielectric layer that is removed in a subsequent high-temperature step.

DETAILED DESCRIPTION OF THE INVENTION

This invention enables the formation of a textured capacitor electrode through the use of silicon nodules formed as they are deposited on the smooth planar surface of the capacitor electrode. The invention is applicable to both deep trench capacitors as well as to planar capacitors. The following is a description of the process that uses the deep trench capacitor as our learning vehicle.

The initial capacitor electrode structure, whether horizontal or vertical, is made using conventional silicon processing and lithography techniques. In the case of the deep trench capacitor this involves the formation of a deep trench using conventional Si etching techniques.

Figure 1:
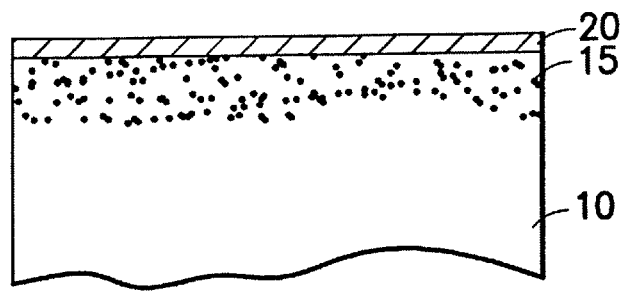
FIGS. 1–5 show a cross section of a capacitor at various stages of construction according to the invention.

The sidewall for the trench or capacitor electrode may be cleaned by any number of techniques including but not limited to BHF, DHF and Huang AB chemistries. After this surface preparation is complete, a thin dielectric film e.g. nitride ($Si_3N_4$) or oxide ($SiO_2$) (referred to as the dielectric seeding layer), which will serve as the surface upon which the silicon nodules are grown, is then deposited. A thin nitride may then be deposited on the surface of the capacitor electrode (trench sidewall for deep trench (DT) technology). The nitride may be deposited on an undoped or a doped substrate, shown in FIG. 1 as substrate 10 having a seed layer of nitride 20. Substrate 10 is doped in this example, as indicated by the speckling 15 near the surface. The same figures will be used for both trench capacitors and for horizontal capacitors and for nitride and oxide seed layers. The nitride provides a chemically stable surface upon which the silicon nodules may be formed. The integrity of this nitride layer is good enough that silicon nodules may be deposited on it up to 72 hours after initial nitride deposition without deleterious effect on device performance and capacitance. Thus, the use of this film is a considerable practical advantage that makes the process much more manageable from a manufacturing standpoint, since the processing times between tools may be relaxed. The nitride may be as thin as 5 Å, with the preferable range for device operation being between 5–15 Å. It is preferable to make the dielectric seeding layer as thin as possible.

Alternatively, a chemical oxide may also be used for the layer upon which the silicon nodules are deposited. This chemical oxide may be deposited by thermal oxidation or by wet surface treatments. These wet surface treatments include but are not limited to Huang AB. The preferable range in thickness for this oxide is 10–30 Å.

Figure 2:
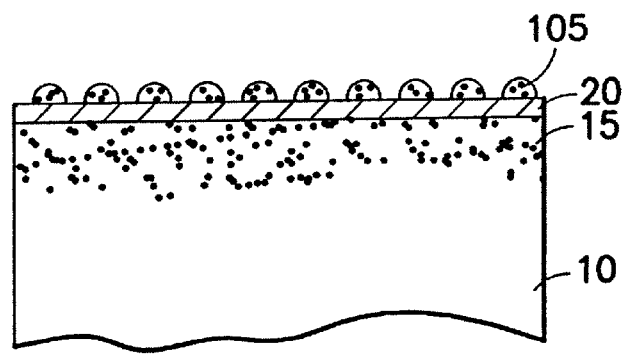

Referring now to FIG. 2, there is shown the result of the silicon deposition step. The silicon nodules may be deposited on the dielectric layer directly using any number of silicon deposition tools which include but may not be limited to low pressure CVD furnace or a reduced pressure chemical vapor deposition single wafer tool.

In the case of the low pressure CVD furnace, the preferred temperature range of silicon nodule formation starts at 500 deg C. and goes up to at least 700 deg C. The nodules may be deposited as amorphous or silicon poly, depending on the temperature.

The deposition process can be operated in the milli-Torr range and higher. Si nodule size, density, shape and separation or conglomeration may be varied using a variety of controls. These controls include deposition temperature, gas flow rate, growth time and chamber pressure. The range of nodule sizes is typically 10 nm–60 nm. The number of cycles of deposition may also be used to control the desired variables. During a deposition cycle the reactant gas is introduced into the chamber the film is allowed to grow, the gas is then pumped out, and the chamber held under pressure of an inert species. The reactant gas is then reintroduced into the chamber after some time. The predominant variable that may be manipulated by cycling is the density of the grains. An anneal is not required for deposition of the nodule in a furnace. If the nodules are formed as amorphous, they may be annealed to convert to poly, and they may also be capped with nitride or oxide. Capping the grains with nitride acts to preserve their texture by covering them with a stable material. It is an advantageous feature of the invention that the nodules are formed during the deposition step and no additional anneal step is required.

The parameters of a deposition are usually adjusted to produce a uniform film, not to form nodules. It is another advantageous feature of the invention that the silicon does not "wet" the seed layer, so that nodules form without any critical adjustment of the processing parameters to make the nodule formation happen. Thus, the parameters are all available to fine-tune the nodule size, density, etc. The temperature and deposition time may be used to modulate the grain size. The pressure and the number of deposition cycles may be used to modulate density. The gas flow rate will affect the grain growth rate. It is another advantageous feature of the invention that the deposition can be performed in the milli-Torr range, not in the high vacuum ($<10^{-2}$ Torr) region that requires expensive equipment.

Figure 3:
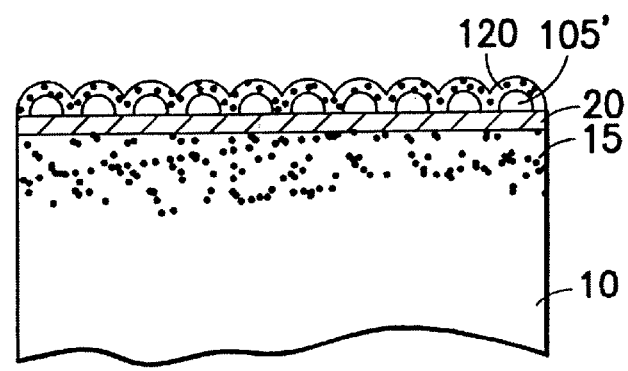

The doping of the silicon nodules, if desired, may be carried out by introducing a dopant gas during deposition. The degree of doping may also be modulated by the flow rate of this gas. The Si nodule size, density, shape, doping and degree of conglomeration are relevant parameters for the purposes of capacitance tuning. FIG. 2 shows the result of putting down the modules simultaneously with the doping and FIG. 3 shows an alternative, in which nodules 105' have been formed undoped and a doping layer of any convenient material (e.g. amorphous silicon) containing a high concentration of dopant has been put down. The dopant will be diffused from the doping layer into the nodules and, if desired, further through the seeding layer 20 into the substrate 10. If the dopant layer is to be removed, consideration will be given to selecting a dopant material that can be etched without damaging the nodules.

Silicon nodules may also be deposited in a reduced pressure chemical vapor deposition tool. In this case deposition temperature may be varied from approximately 560 deg C. up to at least 700 deg C. The operating pressure for the system is greater than in the low pressure CVD case and can be as high as 300 Torr. As in the preceding example, the nodules may be formed as either amorphous or poly and grain size, density, shape and degree of conglomeration may also be modulated by deposition temperature, time, pressure, flow rate and number of deposition cycles. The silicon nodules may be undoped or doped. The doping of the silicon nodules, if desired, may be carried out by introducing a dopant gas during deposition. The degree of doping may also be modulated by the flow rate of this gas. Post deposition, the nodules must be annealed within at most an hour of deposition in order to avoid loss of texture. This anneal is unique to the reduced pressure chemical vapor deposition tool.

The anneal may be carried out up to at least 760 torr, preferably using a rapid thermal anneal process. The gases may be an inert such as Ar or the substrate may be subjected to an anneal under an ambient containing NH3, O2 or other dielectric forming gas. If silicon nitride is used for the capacitor dielectric, NH3 could be used for the annealing ambient; and if silicon oxide is chosen O2 could be used. There are advantages with using a dielectric forming gas (NH3, O2, etc) anneal instead of an inert anneal for device and tooling integration purposes. One advantage is that part or all of the capacitor dielectric may be formed in one step; and the second advantage is that the silicon nodules may be covered by a thermally stable compound. Furthermore, if an option is chosen so that the complete capacitor dielectric is deposited in this step, it reduces contamination concerns associated with moving between tools and wafer handling.

Integrating the silicon nodules into the capacitor system

It is important to electrically connect the Si nodules to the capacitor electrode in order to achieve a capacitance enhancement over a smooth capacitor electrode system. This connection may be accomplished by independently doping the Si nodules and the capacitor plate or by doping them simultaneously. The Si nodules can be independently doped during the deposition process or after the deposition process is complete using a variety of techniques, which include but are not limited to putting a dopant layer on the surface and driving the dopant through the Si nodules by an anneal. The electrical connection can also by made by doping in one step the capacitor plate and the Si nodules. This method includes but is not limited to using doped Si nodules and driving that through to the underlying substrate using an anneal. Alternatively, the dopant may also be driven in by putting a doping layer over the Si nodules and driving the dopant through the nodule and into the capacitor plate via an anneal. The thin seeding layer upon which the silicon nodules are deposited is leaky and provides minimal resistance between the silicon nodule and the capacitor plate.

Figure 4:
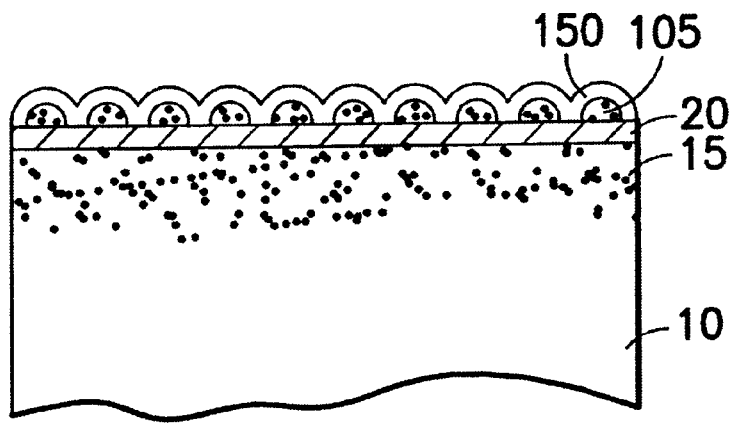
Figure 5:
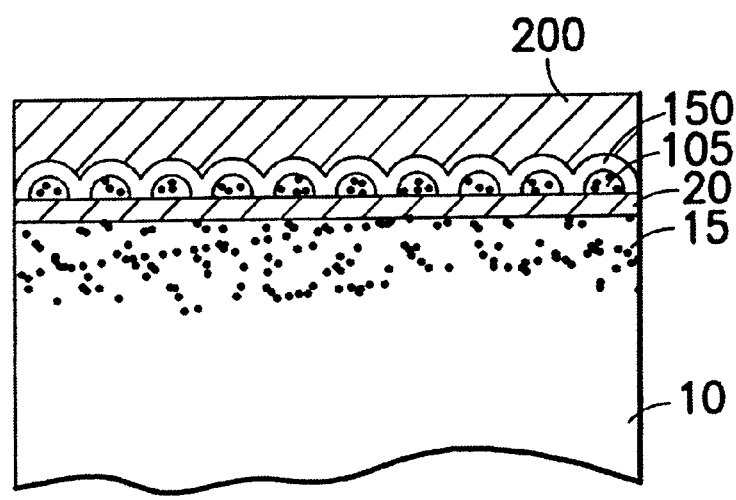

After the silicon nodule formation, a capacitor dielectric film 150 may be deposited over the stack which comprises the Si nodule/thin dielectric/bottom capacitor plate as shown in FIG. 4. The top electrode 200 can then be deposited. The top electrode may consist of, for example, a polysilicon film. The final capacitor is shown in FIG. 5.

The Si nodules produced using this technique have been shown to be stable after being subjected to thermal budgets of up to more than 950 deg C. at 3 hours following silicon nodule formation and for anneals of greater than 1065 deg C., 100 secs post the capacitor dielectric film deposition.

The use of nitride films (5–15 Å) or chemical oxides ~20 Å for the layer upon which the Si nodules are deposited is also uniquely advantageous because these films will break up and move from the silicon nodule-capacitor plate interface during thermal processing. The break-up and movement of the film thus removes the contact resistance between the Si nodule and the capacitor plate. This feature allows the effective capacitance of the device to be controlled by the dielectric film deposited over the Si nodules without a loss in capacitance from the presence of the dielectric film upon which the silicon nodules are deposited. Thicker nitrides and oxides may also be used but consideration must be giving to the doping of the capacitor plate and the Si nodule to optimize capacitance gain.

While the invention has been described in terms of a single preferred embodiment, those skilled in the art will recognize that the invention can be practiced in various versions within the spirit and scope of the following claims.

What is claimed is:

1. A method of forming a capacitor comprising the steps of:
   forming a first capacitor plate;
   depositing an initial dielectric layer on said first capacitor plate;
   depositing a layer of silicon on said initial dielectric layer so that said layer of silicon forms a layer of silicon nodules;
   doping said layer of silicon nodules;
   depositing a layer of capacitor dielectric over said layer of silicon nodules; and
   forming a second capacitor plate adjacent to said layer of capacitor dielectric.

2. A method of forming a capacitor according to claim 1, in which said initial dielectric layer is nitride having a thickness of less than 2 nm.

3. A method of forming a capacitor according to claim 1, in which said initial dielectric layer is oxide having a thickness of less than 2 nm.

4. A method of forming a capacitor according to claim 1, in which said step of depositing said layer of silicon is performed through low pressure CVD.

5. A method of forming a capacitor according to claim 2, in which said step of depositing said layer of silicon is performed through low pressure CVD.

6. A method of forming a capacitor according to claim 3, in which said step of depositing said layer of silicon is performed through low pressure CVD.

7. A method of forming a capacitor according to claim 1, in which said step of depositing said layer of silicon is performed through reduced pressure CVD at a pressure greater than about 10 mTorr and less than about 300 mTorr; and further comprising an anneal of said silicon nodules.

8. A method of forming a capacitor according to claim 2, in which said step of depositing said layer of silicon is performed through reduced pressure CVD at a pressure greater than about 10 mTorr and less than about 300 mTorr; and further comprising an anneal of said silicon nodules.

9. A method of forming a capacitor according to claim 3, in which said step of depositing said layer of silicon is performed through reduced pressure CVD at a pressure greater than about 10 mTorr and less than about 300 mTorr; and further comprising an anneal of said silicon nodules.

10. A method of forming a capacitor according to claim 5, in which said step of depositing said layer of silicon is performed at a temperature greater than about 550 degrees C.

11. A method of forming a capacitor according to claim 7, in which said step of depositing said layer of silicon is performed at a temperature greater than about 500 degrees C.

12. A method of forming a capacitor according to claim 1, in which said step of doping said layer of silicon is performed simultaneously with said step of depositing said layer of silicon nodules.

13. A method of forming a capacitor according to claim 1, in which said step of depositing a layer of dielectric over said layer of silicon nodules is performed simultaneously with said step of annealing said layer of silicon nodules.

14. A method of forming a capacitor according to claim 1, in which said step of annealing said layer of silicon nodules us performed within one hour of said step of depositing said layer of silicon nodules.

15. A method of forming a capacitor according to claim 8, in which said step of annealing said layer of silicon nodules us performed within one hour of said step of depositing said layer of silicon nodules.

16. A method of forming a capacitor according to claim 9, in which said step of annealing said layer of silicon nodules us performed within one hour of said step of depositing said layer of silicon nodules.

17. A method of forming a capacitor according to claim 1, in which said step of depositing a layer of silicon on said initial dielectric layer is performed in at least two steps in which a reactant gas flows over said first capacitor plate, said at least two steps being separated in time by at least one period in which said reactant gas is absent and only substantially inert gases are exposed to said first capacitor plate.

18. A method of forming a capacitor according to claim 4, in which said step of depositing a layer of silicon on said initial dielectric layer is performed in at least two steps in which a reactant gas flows over said first capacitor plate, said at least two steps being separated in time by at least one period in which said reactant gas is absent and only substantially inert gases are exposed to said first capacitor plate.

19. A method of forming a capacitor according to claim 7, in which said step of depositing a layer of silicon on said initial dielectric layer is performed in at least two steps in which a reactant gas flows over said first capacitor plate, said at least two steps being separated in time by at least one period in which said reactant gas is absent and only substantially inert gases are exposed to said first capacitor plate.

20. A method of forming a capacitor according to claim 12, in which said step of depositing a layer of silicon on said initial dielectric layer is performed in at least two steps in which a reactant gas flows over said first capacitor plate, said at least two steps being separated in time by at least one period in which said reactant gas is absent and only substantially inert gases are exposed to said first capacitor plate.

* * * * *